TUNING GYROMETER

Inventors
René Fillod
Gérard Lallement
Claude Oudet

Stevens, Davis, Miller & Mosher
Attorneys

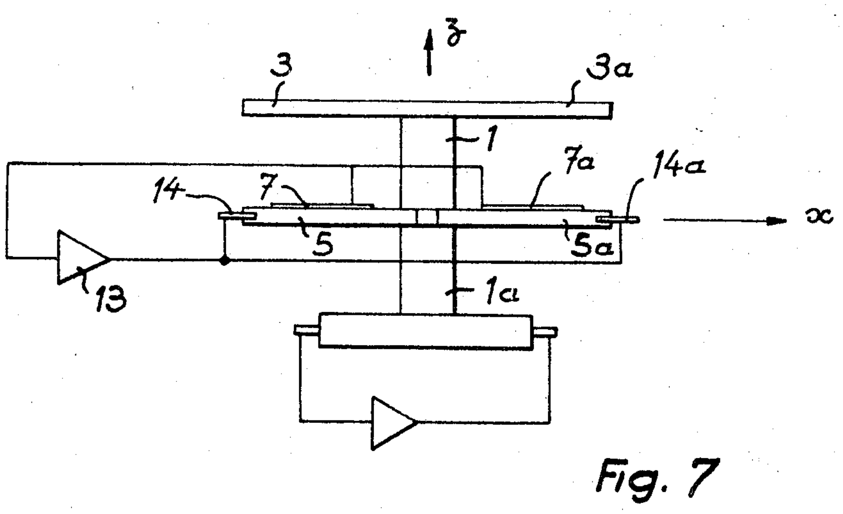
Fig. 7
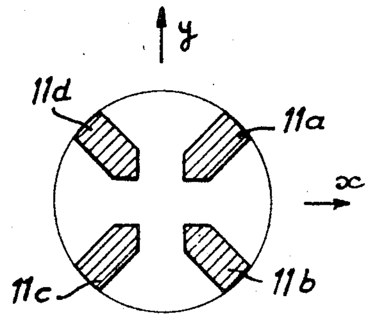
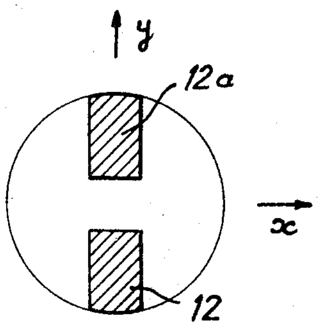
Fig. 5 Fig. 6
Inventors
René Fillod
Gérard Lallement
Claude Oudet
Stevens, Davis, Miller & Mosher
Attorneys United States Patent Office 3,460,396
Patented Aug. 12, 1969

3,460,396
TUNING GYROMETER

René Fillod, Gérard Lallement, and Claude Oudet, Besancon, France, assignors to Société dite Jaz S.A., Paris, France Filed Mar. 8, 1966, Ser. No. 532,646
Claims priority, application France, Mar. 10, 1965, 8,577
Int. Cl. G01p *15/02*
U.S. Cl. 73—505 11 Claims

ABSTRACT OF THE DISCLOSURE

A tuning gyrometer comprising a torsional tuning fork or oscillator and an H-shaped tuning fork. The H-shaped tuning fork has two sets of vibratory strips constituting the arms of the H. One of the sets of strips being attached to the torsional tuning fork at an end of the torsional tuning fork and the second of the sets of strips being connected at the nodal plane of the torsional tuning fork. At the other end of the torsional tuning fork there is an accelerometer.

The invention relates to a tuning gyrometer.

In certain conventional gyrometers, the arrangement comprises at least one oscillatory or vibratory member in place of the rotary members which are used in the well-known "spinning top" gyrometers.

These gyrometers are constituted by an arrangement which is able to produce at least two types of vibrations at the same frequency F. A study of the theory behind this arrangement shows that it is advisable that these two types of vibration should be completely independent of each other when there is no movement of gyration. At the same time, each type of vibration must result in perfect pitch, i.e. the degree of kinematic movement and moment must be zero.

However, a U-shaped tuning fork never gives perfect pitch whereas two tuning forks combined and extending in opposite directions to form an H, gives so-called perfect pitch.

It is thus a specific object of the invention to provide a gyrometer constituted by an arrangement which produces two types of vibration in so-called perfect pitch and the invention consists in a tuning gyrometer that comprises a combination of a torsional tuning fork and an H-shaped tuning fork which are completely decoupled from each other when there is no movement of gyration, while the gyration is picked up by two vibratory strips forming part of the H-shaped tuning fork by means of extensometers which are bonded to the strips which are located in the nodal plane of the torsional tuning fork.

The torsional movement is produced by means of piezo-electrical strips which may be single or double and which function in the manner of an accelerometer and are located on the part of the tuning fork arrangement which is not sensitive to the movement of gyration.

Figure 1:
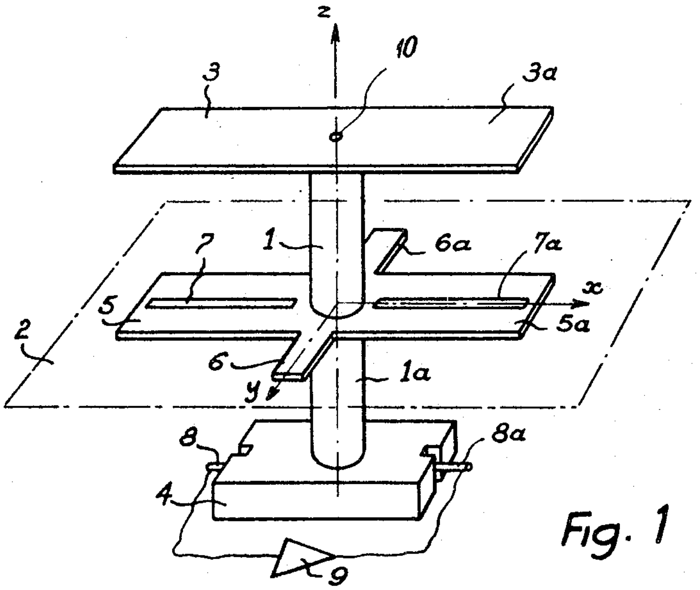
Figure 2:
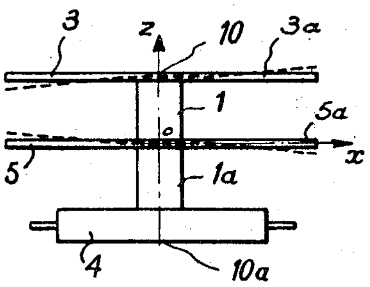
Figure 3:
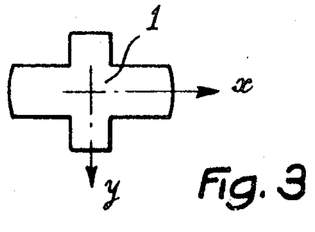
Figure 4:
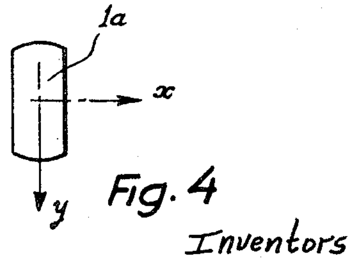

In order that the invention may be more clearly understood, reference will now be made to the accompanying drawings which show some embodiments thereof by way of example, and in which:

FIGURE 1 is a perspective view of a complete gyrometer according to the invention, FIGURE 2 is an elevational view of the gyrometer showing the deformation of the H-shaped tuning fork, FIGURE 3 is a sectional view through a plane perpendicular to the axis of one of the deformable rods of the torsional tuning fork, FIGURE 4 is a sectional view similar to that of FIGURE 3 of the other deformable rod of the torsional tuning fork, FIGURE 5 is a sectional view through a plane perpendicular to the axis of one of the deformable members of the torsional tuning fork, FIGURE 6 is a sectional view similar to that of FIGURE 1 of one of the deformable members of the torsional tuning fork, and FIGURE 7 is an elevational view of another embodiment of the gyrometer according to the invention.

Referring now to the drawings, a gyrometer of the invention as shown in FIGURE 1 is constituted by a torsional tuning fork arrangement comprising two torsional members in the form of rods 1, 1*a* which form the torsion springs and which have a particular cross-sectional shape described below.

These torsion rods 1, 1*a* are in line with each other and are connected together in a nodal oscillatory and torsional plane 2 which is defined by the axes OX, OY so as to form a single rod, the ends of which are secured to vibratory strips 3, 3*a* and a part 4 which form parts of the torsional tuning fork and which oscillate in phase opposition.

The axis OZ of the torsion rods 1, 1*a*, which is the geometrical axis of torsion, forms with the axes OX, OY a trirectangular trihedron.

Vibratory strips 5, 5*a* secured to the torsion rods 1, 1*a* in their nodal plane 2 are parallel to the vibratory strips 3, 3*a* respectively. The strips 3, 3*a*, 5, 5*a* vibrate in the plane OX, OZ and are secured in the plane OY, OZ. Since their basic frequencies are attuned to the torsion rod 1, they constitute an H-shaped tuning fork arrangement with the same frequency as that of the torsional tuning fork.

This arrangement is secured more or less rigidly to a support, which is not shown in the drawing, by means of rods 6, 6*a* which are centred in the plane 2 and extend on either side of the strips 5, 5*a* along the axis OY.

Clearly, the torsional vibration does not cause the basic transverse vibrations of the strips 3, 3*a*, 5, 5*a*, and the transverse vibration of these strips does not produce the torsional vibration.

It should be noted that a shortening of the torsion rods 1, 1*a* at a frequency 2F caused by the torsion does not produce a larger overtone than the strips 3, 3*a*.

The transverse vibration of the strips 3, 3*a* automatically causes a sympathetic vibration in the strips 5, 5*a*. When a torsional vibration is set up in the torsional tuning fork 1, 1*a* the transverse vibration of the strips 3, 3*a* appears as a result of gyration about the axis OX along the deformation shown in dotted lines in FIGURE 2. The strips 5, 5*a* then begin to vibrate at the same amplitude as the strips 3, 3*a* respectively but in opposite phase.

Members 7, 7*a* which pick up the gyration are bonded to the strips 5, 5*a*. The gyration is thus picked up by members which are perfectly motionless when there is no gyrational movement since they are located in the nodal plane of torsional vibration.

These pick-up members 7, 7*a* are preferably extensometers which measure the elongation of the surface fibres under the effect of the transverse deformational stress and which are constituted by bonded piezo-electric crystals or metal or semi-conductor strain gauges.

The use of extensometers which are bonded to the strips 5, 5*a* and are sensitive along their full length enables all the signals related to the upper overtones of the strip or, more generally all the high frequency components of the sounds transmitted by the gyrometer support to be integrated, as is not possible using the conventional type of local pick-up arrangement placed at the ends of the strips. Strain gauges are moreover advantageous for constituting perfectly directional extensometers.

Four gauges are used as required and are bonded to each of the faces 5, 5*a* and connected together so that any signal resulting from deformation in a direction contrary to that effected by the movement of gyration—such as those produced for vibrations or shocks in the direction OZ—is eliminated.

The torsional movement is initiated by means of single or double piezo-electric strips 8, 8*a* which function conventionally as an accelerometer and are located on the part 4 which is not sensitive to the movement of gyration. One of the elements 8, 8*a* acts as a pick-up and the other as the exciter member, the former being connected to the latter through the amplifier 9.

The pick-up may also be constituted by one or more semi-conductor gauges which are bonded to the torsion rods 1 and 1*a*. In this case, the two elements 8, 8*a* act as an exciter member. This method of maintaining torsional vibrations also possesses the advantage of rendering the process of excitation independent of the vibration of the support.

In operation, the torsional tuning fork 1, 1*a* is driven by the single or double piezo-electric strips 8, 8*a* which act as an accelerometer.

When a torsional vibration is set up in the torsional tuning fork 1, 1*a* the transverse vibration of the strips 3, 3*a* appears as a result of gyration about the axis OX, FIGURE 2. The strips 5, 5*a* vibrate at the same amplitude as the strips 3, 3*a*, respectively, but in opposite phase. The gyration of the strips 5, 5*a* is picked up by members 7, 7*a* located on the strips 5, 5*a*.

The torsion rod 1 may be of cruciform cross-section, as shown in FIGURE 3, in order to have a greater degree of rigidity to flexure in the plane along the axes OX, OY so that this rod couples the strips 3 and 3*a* to the strips 5 and 5*a* without being deformed.

In order to avoid any residual deformation of the rod 1 causing any transverse movement of the part 6, the rod 1*a* may be of rectangular cross-section, as shown in FIGURE 4, so as to have, in contrast to the rod 1, a low moment of inertia to flexure in the plane along the axes OX, OZ.

A further advantage of the design of the gyrometer of the invention lies in the fact that the strips 3, 3*a*, 5, 5*a* may be machined by rotating the part about the axis of torsion OZ by means of the centre points 10, 10*a*.

The plane of the strips 3, 3*a* may thus be perfectly perpendicular to the axis OZ, this being shown by theory to be a fundamental desideration. Similarly, the cross-sectional shapes of the torsion rods as shown in FIGURES 3 and 4 may be accurately obtained by turning them about the same center points. The whole assembly may be produced from a single block of material, the advantages of which are obvious.

In another embodiment a device which produces a damping effect by means of Foucault or eddy currents may be secured to the strips 5, 5*a*.

FIGURE 5 shows an embodiment of the torsion rod 1 which is constituted by four parallel rods 11*a*, 11*b*, 11*c*, 11*d* arranged to form a cross.

FIGURE 6 shows an embodiment of the torsion member 1*a* which is constituted by two parallel rods 12, 12*a*. This embodiment has the advantages of the shape shown in FIGURES 3 and 4 and also the advantage that the shape of the rods is such that the springs of the torsional oscillator are subjected almost exclusively to bending stresses.

Consequently the frequencies of the flexural and torsional oscillators are dependent solely on the same Young's modulus. The differential tuning of the frequencies of the two oscillators is thus independent of temperature or of any other known parameter.

Another embodiment of the tuning gyrometer shown in FIGURE 7 comprises an adjustable damping arrangement for the H-shaped tuning fork, which is composed of electronic circuits.

The pick-up members 7, 7*a* which are extensometers, are connected through an amplifier 13 to exciter members 14, 14*a* which are preferably of piezo-electric form and are located at the ends of the strips 5, 5*a* of the H-shaped tuning fork, the said exciter members 14, 14*a* being located in the nodal plane of the torsional oscillator.

The signal which is produced by the pick-up members 7, 7*a* is amplified at 13 and applied to the exciter members 14, 14*a*. The amplifier 13 supplies a signal, the law of which is the velocity of movement of the H-shaped tuning fork. This adjustable damping aims to diminish or increase the time constant of the gyrometer and also to adjust or render the sensitivity of the apparatus independent of the variations in excess voltage pertinent to the H-shaped tuning fork.

In another modification, the flexure strips 5, 5*a*, shown in FIGURE 1, may be smaller than the strips 3, 3*a* with which they form the H-shaped tuning fork. They remain, of course, tuned to the same frequency. These small strips vibrate at a greater amplitude since for a given gyration their power remains constant. The signal produced by the gyration pick-up member (piezo-electric or piezo-resistive elements) is more powerful and the sensitivity of the gyrometer is increased.

We claim:

1. A tuning gyrometer comprising the combination of a torsional tuning fork and an H-shaped tuning fork with first and second sets of two vibrating strips, said sets having related natural frequencies so that when one set is vibrated, the other set will vibrate in sympathy, said first set of vibratory strips being at one end of said torsional tuning fork and said second set of vibratory strips being connected at the nodal plane of said torsional tuning fork, extensometer members mounted on said second set of vibratory strips, said two tuning forks being de-coupled when there is no movement of gyration while the gyration is picked up on said second set of vibratory strips located in the nodal plane of said torsional tuning fork by said extensometer members and, drive means for oscillating the torsional tuning fork.

2. A tuning gyrometer according to claim 1, wherein said torsional tuning fork is constituted by two torsion members in the form of rods arranged in line with each other and connected in the nodal plane of said torsional tuning fork so as to effectively constitute a single rod, having two ends, and two parts secured to said two ends of said rod, said two parts being oscillable in phase opposition, one of said oscillable parts being constituted by said first sets of vibratory strips of said H-shaped tuning fork, the planes of said strips being perpendicular to the axis of said torsion members.

3. A tuning gyrometer according to claim 1, comprising a support, rod means securing said gyrometer to said support, said rod means being centered in the nodal plane of said torsional tuning fork and extending on either side of said second set of vibratory strips of said H-shaped tuning fork along an axis perpendicular to the axis of said strips.

4. A tuning gyrometer according to claim 2, wherein one of said torsional members located between said two sets of vibratory strips is constituted by a rod of cruciform cross-section, while the other torsional member is a rod of rectangular cross-section.

5. A tuning gyrometer according to claim 2, wherein one of said torsion members located between said two sets of vibratory strips is constituted by four parallel rods arranged to form a cross, while the other torsion member is constituted by four rods, the axes of which are parallel and located on the same axis.

6. A tuning gyrometer according to claim 1, wherein said extensometer members are constituted by piezo-electric crystals.

7. A tuning gyrometer according to claim 1, wherein said extensometer members consist of strain gauges which are bonded to each of the faces of said second set of vibratory strips.

8. A tuning gyrometer according to claim 2, wherein said means for oscillating said torsional tuning fork comprise exciter members constituted by piezo-electric strips which respectively function as a pick-up and an excited member, and are located on the oscillable part of said tuning fork which is located opposite the part formed by said first set of vibratory strips.

9. A tuning gyrometer according to claim 1, wherein the torsional tuning fork drive means include at least one semi-conductor strain gauge bonded to at least one of said torsional members of said torsional tuning fork.

10. A tuning gyrometer according to claim 1, wherein said extensometer members are bonded to said second set of vibratory strips and are connected through an amplifier to exciter members, located at the ends of the said H-shaped tuning fork and in the nodal plane of said torsional oscillator.

11. A tuning gyrometer according to claim 2, wherein said second set of vibratory strips located in the nodal plane of said torsional tuning fork are smaller than the said first set of vibratory strips of said H-shaped tuning fork.

References Cited

UNITED STATES PATENTS

| | | | |
|---|---|---|---|
| 2,514,250 | 7/1950 | Meredith | 73—505 XR |
| 3,113,463 | 12/1963 | Holt | 73—505 |
| 3,302,465 | 2/1967 | Mathey | 73—505 |

FOREIGN PATENTS

| | | |
|---|---|---|
| 611,011 | 10/1948 | Great Britain. |

JAMES J. GILL, Primary Examiner